(12) United States Patent
Ishigami

(10) Patent No.: US 7,680,467 B2
(45) Date of Patent: Mar. 16, 2010

(54) DISTORTION COMPENSATING AMPLIFIER

(75) Inventor: Takeshi Ishigami, Kodaira (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1038 days.

(21) Appl. No.: 11/373,102

(22) Filed: Mar. 13, 2006

(65) Prior Publication Data

US 2006/0238246 A1    Oct. 26, 2006

(30) Foreign Application Priority Data

Apr. 22, 2005    (JP) .............................. 2005-124467

(51) Int. Cl.
*H04B 1/04* (2006.01)
*H01Q 11/12* (2006.01)

(52) U.S. Cl. ................ 455/114.2; 455/127.3; 455/63.1; 455/67.13; 375/297; 330/136; 330/149

(58) Field of Classification Search .............. 455/114.1, 455/114.2, 114.3, 127.2, 127.3, 63.1, 67.11, 455/67.13; 375/296, 297; 330/127, 129, 330/136, 149

See application file for complete search history.

(56) References Cited

U.S. PATENT DOCUMENTS

| 6,066,984 | A  | * | 5/2000 | Tomaru et al. ............... 330/149 |
| 6,727,751 | B2 | * | 4/2004 | Yonenaga et al. ........... 330/149 |
| 6,940,346 | B2 | * | 9/2005 | Miyaji et al. ................. 330/151 |
| 7,170,346 | B2 | * | 1/2007 | Jelonnek et al. ............. 330/149 |
| 7,190,223 | B2 | * | 3/2007 | Ueno et al. .................. 330/149 |

* cited by examiner

*Primary Examiner*—Quochien B Vuong
(74) *Attorney, Agent, or Firm*—Wenderoth, Lind & Ponack, L.L.P.

(57) ABSTRACT

In a distortion compensating amplifier that compensates for distortion occurring in main amplifiers, a first amplifying unit amplifies, with a first main amplifier, a first signal consisting of a main signal to be amplified and detects distortion occurring in the first main amplifier, a distortion adjusting unit subjects the distortion detected by the first amplifying unit to vector adjustment, a second amplifying unit combines a second signal consisting of the main signal to be amplified and the distortion supplied from the distortion adjusting unit and amplifies a combined signal with a second main amplifier, and a combining unit combines an amplified signal supplied from the first amplifying unit and an amplified signal supplied from the second amplifying unit.

20 Claims, 6 Drawing Sheets

DISTORTION COMPENSATING AMPLIFIER

BACKGROUND OF THE INVENTION

1. Field of the Invention

The present invention relates to a distortion compensating amplifier that compensates for distortion occurring in an amplifier that amplifies a signal, and, more particularly to a highly efficient distortion compensating amplifier that realizes highly accurate distortion compensation.

2. Description of the Related Art

For example, in a base station apparatus and a relay station apparatus for mobile communication, a multi-carrier signal including a large number of carrier waves, which are properly modulated at predetermined frequency intervals, respectively, is transmitted by radio after being subjected to high-frequency amplification. When linearity of an amplifier used for the high-frequency amplification is not sufficiently high, various kinds of distortion such as intermodulation distortion occur. This distortion hinders realization of normal and high-quality communication. Therefore, an amplifier used for amplification of a multi-carrier signal is required to have high linearity over an entire frequency band to which the multi-carrier signal belongs.

As one method of realizing an ultra-low distortion amplifier suitable for amplification of a multi-carrier signal, there is a feed forward (FF) amplification system.

For example, a signal path extending from a signal input terminal to a signal output terminal through a main amplifier, that is, a signal path for transmitting a signal that should be amplified and an amplified signal, is called a main line. In the FF amplification system, a distortion detection loop for connecting a signal branching from a certain point at a post-stage behind the main amplifier on the main line and a signal branching from a certain point in a pre-stage before the main amplifier on the main line is provided. If electrical lengths of signal paths through which both the signals are transmitted are equal to each other and both the signals have opposite phases at the same amplitude, it is possible to extract a signal equivalent to distortion occurring in the main amplifier and peripheral circuits thereof by canceling carrier wave components according to an operation of the signal combination.

In the FF amplification system, a distortion compensation loop is further provided to recombine the signal extracted in the distortion detection loop, that is, the signal equivalent to distortion, with the signal on the main line. When a signal delay in the distortion compensation loop is compensated on the main line and adjustment of an amplitude or a phase is performed in the distortion compensation loop or the main line such that distortion components included in the signal on the main line and a signal obtained from the distortion compensation loop have opposite phases at the same amplitude, it is possible to compensate for the distortion occurring in the main amplifier according to an operation of the signal recombination.

FIG. 5 is a diagram of an example of a circuit configuration of a feed forward amplifier (FF amplifier).

In the FF amplifier in this example, a distortion detection loop L1 and a distortion compensation loop L2 are formed using three hybrids 61, 66, and 71. In FIG. 5, a signal path extending from a signal input terminal IN to a signal output terminal OUT through a main amplifier 64 and a coaxial delay line 67 is a main line. A signal path extending from the input terminal IN to an output terminal of the hybrid 66 through a coaxial delay line 65 is the distortion detection loop L1. A signal path extending from the output terminal of the hybrid 66 to an output terminal of the hybrid 71 through an auxiliary amplifier 70 is the distortion compensation loop L2. Dummy loads 81 and 82 have impedances equal to a characteristic impedance of the line and are used for a trailing end of a terminal of the hybrid 61 and a trailing end of a terminal of the hybrid 71, respectively. The main amplifier 64 and the auxiliary amplifier 70 are constituted by combining, for example, plural amplification elements 91a to 91d and plural amplification elements 92a to 92d, respectively.

When, for example, a multi-carrier signal is applied to the signal input terminal IN as a signal, this signal is inputted to a variable attenuator 62 and a variable phase-shifter 63 via the hybrid 61. The signal is subjected to adjustment of an amplitude and a phase by the variable attenuator 62 and the variable phase-shifter 63 and amplified by the main amplifier 64. The signal amplified by the main amplifier 64 is inputted to the hybrid 66 and, at the same time, inputted to the hybrid 71 via the coaxial delay line 67. The signal is outputted to a circuit at a post-stage from the hybrid 71 via the signal output terminal OUT. The coaxial delay line 67 is a delay line for compensating for a signal delay occurring in, in particular, the auxiliary amplifier 70 that is a circuit constituting the distortion compensation loop L2.

A signal inputted from the signal input terminal IN is divided into two signals by the hybrid 61. The two divided signals are the same in terms of a frequency configuration of components. Whereas the divided signal supplied to the main line side is amplified by the main amplifier 64, the divided signal supplied to the distortion detection loop L1 side is supplied to the hybrid 66 from the hybrid 61 via the coaxial delay line 65 while generally keeping an amplitude thereof. The coaxial delay line 65 is a delay line for compensating for a signal delay occurring in, in particular, the main amplifier 64 that is a circuit on the main line side. The signal supplied to the hybrid 66 via the coaxial delay line 65 is combined with a signal including distortion components by the hybrid 66.

The hybrid 66 divides the signal including the distortion components outputted from the main amplifier 64 into two signals. The two divided signals are the same in terms of a frequency configuration of components. One divided signal is supplied to the main line side and the other divided signal is supplied to the distortion compensation loop L2 side. In supplying the other divided signal to the distortion compensation loop L2, the hybrid 66 combines this signal and the signal supplied through the coaxial delay line 65 to thereby extract the distortion components from this signal while canceling carrier wave components in this signal.

A signal obtained as a result of this combination is supplied from the hybrid 66 to the variable attenuator 68, the variable phase-shifter 69, and the auxiliary amplifier 70 constituting the distortion compensation loop L2. The signal is subjected to adjustment of an amplitude and a phase by the variable attenuator 68 and the variable phase-shifter 69, amplified by the auxiliary amplifier 70, and inputted to the hybrid 71. The signal inputted to the hybrid 71 is combined with the signal supplied through the coaxial delay line 67 in the hybrid 71. Consequently, the distortion is canceled and an amplified signal after distortion compensation is outputted from the signal output terminal OUT.

In order to cancel the carrier wave components and extract the distortion occurring in the main amplifier 64 and the like by combining the divided signal of the output signal supplied from the main amplifier 64 and the signal supplied through the coaxial delay line 65, a predetermined number of carrier wave components included in the divided signal of the output signal supplied from the main amplifier 64 and the same number of carrier wave components included in the signal supplied through the coaxial delay line 65 are required to have the same timing, the same amplitude, and opposite phases at the point of the combination in the hybrid 66. The coaxial delay line 65 is means that sets carrier wave components at the same timing.

As another example, there is a cross-cancel system that is a distortion compensation system higher in efficiency than the FF amplification system. Briefly, the cross-cancel system is a system in which the main amplifier 64 of the FF amplification system shown in FIG. 5 is divided into two amplifiers to combine main signals and cancel only distortion components. Compared with the FF amplification system shown in FIG. 5, since the auxiliary amplifier 70 for amplifying distortion components is unnecessary, the cross-cancel system has higher efficiency.

An example of a circuit configuration of an amplifier of the cross-cancel system is shown in FIG. 6A.

The cross-cancel system is different from the FF amplification system shown in FIG. 5 mainly in that the main amplifier 64 is divided into two amplifiers and used as a first main amplifier 104 and a second main amplifier 110 instead of the main amplifier 64 and the auxiliary amplifier 70. The auxiliary amplifier 70 used in the FF amplification system is not used. The cross-cancel system is also different from the FF amplification system in that a 3 dB coupler or a combiner is used as a hybrid 111. The main amplifiers 104 and 110 are constituted by combining, for example, plural amplification elements 131a to 131c and plural amplification elements 132a to 132c, respectively.

In the amplifier of the cross-cancel system in this example, the distortion detection loop L1 and the distortion compensation loop L2 are formed using three hybrids 101, 106, and 111. In FIG. 6A, a signal path extending from the signal input terminal IN to the signal output terminal OUT through the first main amplifier 104 and a coaxial delay line 107 is a main line. A signal path extending from the signal input terminal IN to an output terminal of the hybrid 106 through a coaxial delay line 105 is the distortion detection loop L1. A signal path extending from the output terminal of the hybrid 106 to an output terminal of the hybrid 111 through the second main amplifier 110 is the distortion compensation loop L2. Dummy loads 121 and 122 have impedances equal to a characteristic impedance of the line and are used for a trailing end of a terminal of the hybrid 101 and a trailing end of a terminal of the hybrid 111, respectively.

An example of an operation in the cross-cancel system is described below.

When, for example, a multi-carrier signal is applied to the signal input terminal IN as a signal, this signal is inputted to a variable attenuator 102 and a variable phase-shifter 103 via the hybrid 101, subjected to adjustment of an amplitude and a phase by the variable attenuator 102 and the variable phase-shifter 103, and amplified by the first main amplifier 104. The signal amplified by the first main amplifier 104 is inputted to the hybrid 111 via the hybrid 106 and the coaxial delay line 107. A signal on the main line generated at this point is set as A (in this explanation, representing a vector) and distortion components at this point are set as B (in this explanation, representing a vector). The coaxial delay line 107 is a delay line for compensating for a signal delay occurring in, in particular, the second main amplifier 110 that is a circuit constituting the distortion compensation loop L2.

A signal inputted from the signal input terminal IN is divided into two signals by the hybrid 101. The two divided signals are the same in terms of a frequency configuration of components. Whereas the divided signal supplied to the main line side is amplified by the first main amplifier 104, the divided signal supplied to the distortion detection loop L1 side is supplied from the hybrid 101 to the hybrid 106 via the coaxial delay line 105 while generally keeping an amplitude thereof. The coaxial delay line 105 is a delay line for compensating for a signal delay occurring in, in particular, the first main amplifier 104 that is a circuit on the main line side. The signal supplied to the hybrid 106 via the coaxial delay line 105 is combined with a signal including distortion components by the hybrid 106.

The hybrid 106 divides a signal including distortion components outputted from the first main amplifier 104 into two signals. The two divided signals are the same in terms of a frequency configuration of components. One divided signal is supplied to the main line side and the other divided signal is supplied to the distortion compensation loop L2 side. In supplying the other divided signal to the distortion compensation loop L2, the hybrid 106 combines this signal and a signal supplied through the coaxial delay line 105 to thereby cancel carrier wave components in this signal and extract the distortion components from this signal.

A signal obtained as a result of this combination is supplied from the hybrid 106 to the variable attenuator 108, the variable phase-shifter 109, and the second main amplifier 110 constituting the distortion compensation loop L2. The signal is subjected to adjustment of an amplitude and a phase by the variable attenuator 108 and the variable phase-shifter 109, amplified by the second main amplifier 110, and inputted to the hybrid 111. A signal on the main line at this point is set as C (in this explanation, representing a vector) and distortion components at this point are set as D (in this explanation, representing a vector).

Since the first main amplifier 104 and the second main amplifier 110 are the same amplifiers, amplitudes of the main signal and the distortion components are fine-tuned by the variable attenuator 108 to be the same.

An example (i) of spectra of a signal after being amplified by the first main amplifier 104, an example (ii) of spectra of a signal after being amplified by the second main amplifier 110, and an example (iii) of spectra of a signal after being combined by a coupler serving as the hybrid 111 are shown in FIG. 6A.

In the examples, |A vector| is equal to |C vector|. The vectors are amplitude components of the main signal. |B vector| is equal to |D vector|. The vectors are amplitude components of the distortion components.

A phase of the A vector is set as $\theta 1$, a phase of the B vector is set as $\theta 2$, a phase of the C vector is set as $\theta 3$, and a phase of the D vector is set as $\theta 4$.

In this example, phases of respective main signal components are adjusted to the same phase to combine the main signal components. In other words, $\theta 1$ and $\theta 3$ are set to be equal.

In this example, phases of the distortion components are adjusted to opposite phases to cancel the distortion components. In other words, for example, $\theta 2$ is set equal to $\theta 4$—180 degrees.

An example of a state of combination of distortion components is shown in FIG. 6B.

JP-A-2004-15506 is a patent document describing the technique described above.

In the past, for example, distortion compensation by the cross-cancel system higher in efficiency than the FF amplification system has been examined as described above. However, in the conventional cross-cancel system, it is impossible to control a signal and distortion components on the main line separately. Thus, it is extremely difficult to sets main signal components in the same phase and set the distortion components in opposite phases.

SUMMARY OF THE INVENTION

The invention has been devised in view of such circumstances in the past and it is an object of the invention to provide a highly efficient distortion compensating amplifier that realizes highly accurate distortion compensation.

In order to attain the object, the distortion compensating amplifier according to the invention has a constitution described below to compensate for distortion occurring in main amplifiers (a first main amplifier and a second main amplifier).

In the distortion compensating amplifier, a first amplifying unit amplifies, with a first main amplifier, a first signal consisting of a main signal to be amplified and detects distortion occurring in the first main amplifier. A distortion adjusting unit subjects the distortion detected by the first amplifying unit to vector adjustment. A second amplifying unit combines a second signal consisting of the main signal to be amplified and the distortion supplied from the distortion adjusting unit and amplifies a combined signal with a second main amplifier. A combining unit combines an amplified signal supplied from the first amplifying unit and an amplified signal supplied from the second amplifying unit.

Therefore, as a result of combining the amplified signal supplied from the first amplifying unit and the amplified signal supplied from the second amplifying unit, in obtaining an amplified signal with the distortion compensated, the distortion can be independently subject to vector adjustment by the distortion adjusting unit. Thus, it is possible to realize highly accurate distortion compensation. For example, compared with the FF amplification system, since the auxiliary amplifier is unnecessary, it is possible to realize high efficiency.

As the first signal and the second signal, for example, signals having components of the same main signal are used. The main signal to be amplified is divided and used as the respective signals.

As means that performs vector adjustment, for example, means that changes a level of a signal, means that changes a phase of a signal, or a combination of these means is used.

The distortion compensation amplifier according to the invention has a constitution described below as an example.

The first amplifying unit has means that subjects the first signal amplified by the first main amplifier to vector adjustment. The second amplifying unit has means that subjects the second signal to vector adjustment.

The distortion compensating amplifier has means that controls the vector adjustment in the first amplifying unit, the vector adjustment in the distortion adjusting unit, and the vector adjustment in the second amplifying unit.

Therefore, it is possible to improve accuracy of distortion detection by performing the vector adjustment in the first amplifying unit. It is possible to realize highly accurate distortion compensation by performing the vector adjustment in the distortion adjusting unit and the vector adjustment in the second amplifying unit independently from each other.

The distortion compensating amplifier according to the invention has a constitution described below as an example.

The second main amplifier is constituted as an amplifier having higher power compared with the first main amplifier.

Therefore, it is possible to realize higher efficiency by setting power of the second main amplifier, which is located at a post-stage behind the first main amplifier, high to increase a gain.

Other examples of the constitution of the distortion compensating amplifier are described below.

As an example, the first amplifying unit has means that divides the first signal, means that subjects one divided signal to vector adjustment, the first main amplifier that amplifies a signal after the vector adjustment, and means that combines an amplified signal amplified by the first main amplifier and the other divided signal to detect distortion included in the amplified signal.

As another example, the distortion adjusting unit has means that subject distortion to vector adjustment.

As still another example, the second amplifying unit has means that subjects the second signal to vector adjustment, means that combines a signal after the vector adjustment and distortion supplied from the distortion adjusting unit, and the second main amplifier that amplifies a combined signal.

As still another example, the combining unit has means that combines an amplified signal outputted from the first amplifying unit and an amplified signal outputted from the second amplifying unit.

As still another example, the combining unit combines a main signal (the first signal) amplified by the first main amplifier in the first amplifying unit and distortion occurring in the first main amplifier, the distortion after passing through the second amplifying unit via the distortion adjusting unit, and a main signal (the second signal) amplified by the second main amplifier in the second amplifying unit and distortion occurring in the second main amplifier.

As still another example, the distortion compensating amplifier has means that adds a pilot signal to a signal amplified by the first main amplifier, means that detects a level of a pilot signal included in an output signal supplied from the combining unit, and means that controls vector adjustment in the distortion adjusting unit on the basis of the level of the pilot signal detected.

Alternatively, the distortion compensating amplifier has means that detects a level of distortion included in an output signal supplied from the combining unit and means that controls vector adjustment in the distortion adjusting unit to reduce the level of the distortion detected.

As still another example, the distortion compensating amplifier has means that detects a level of distortion detected by the first amplifying unit and means that controls vector adjustment in the first amplifying unit to reduce the level of the distortion detected.

As still another example, the distortion compensating amplifier has means that detects a level of a main signal included in an output signal supplied from the combining unit and means that controls vector adjustment in the second amplifying unit to increase the level of the main signal detected.

As still another example, the second main amplifier includes plural amplifiers provided in parallel.

As still another example, the second main amplifier includes plural amplifiers, which are identical with the first main amplifier, provided in parallel.

DETAILED DESCRIPTION OF THE INVENTION

An embodiment according to the invention will be explained with reference to the accompanying drawings.

Figure 1:
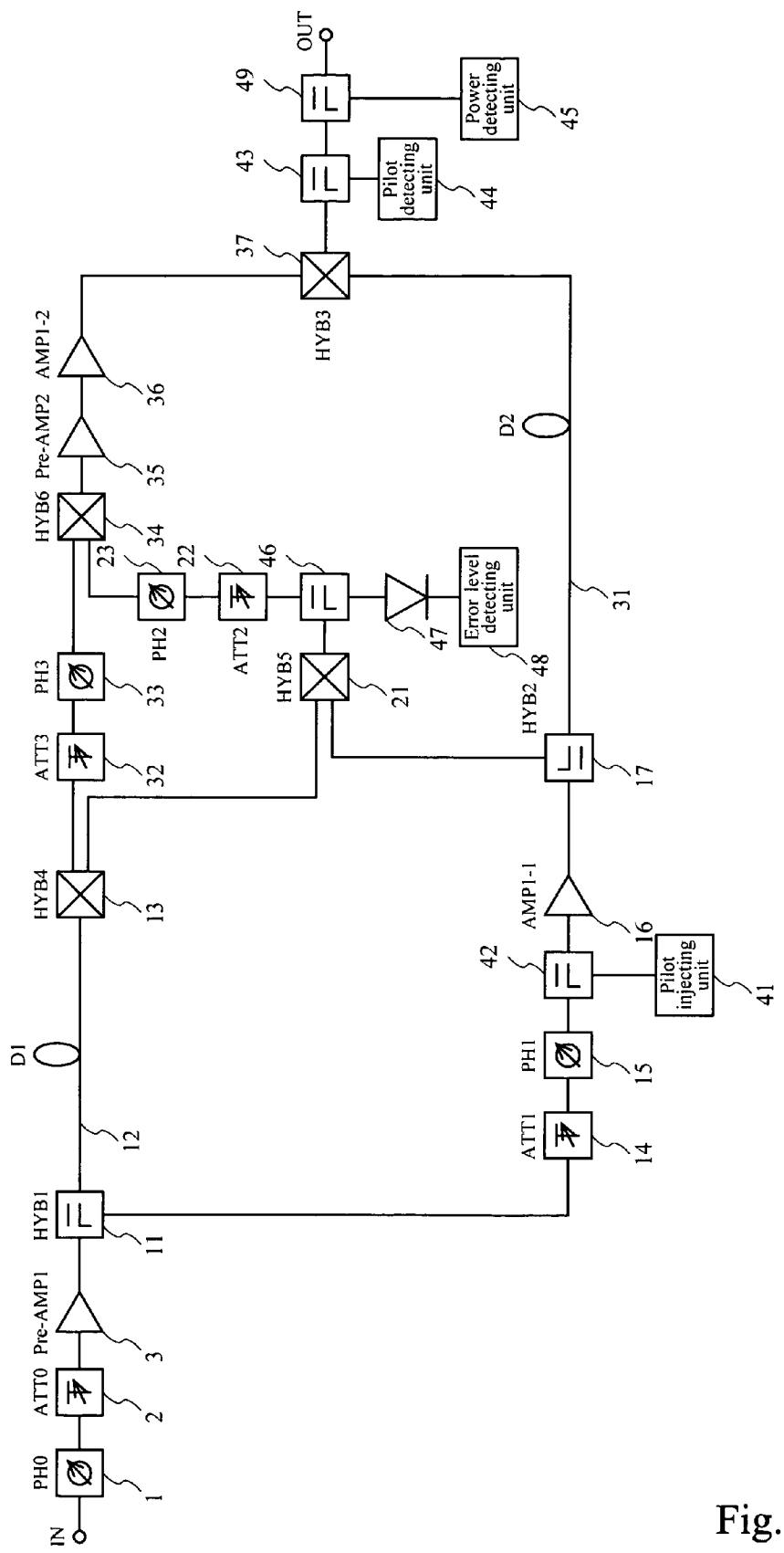
FIG. 1 is a diagram showing an example of a constitution of a distortion compensating amplifier according to an embodiment of the invention.

An example of a circuit configuration of a distortion compensating amplifier in this embodiment is shown in FIG. 1.

The distortion compensating amplifier in this embodiment includes a variable phase-shifter (a zeroth variable phase-shifter) 1, a variable attenuator (a zeroth variable attenuator) 2, a preamplifier (a first preamplifier) 3, a hybrid (a first hybrid) 11, a coaxial delay line (a first coaxial delay line) 12, a hybrid (a fourth hybrid) 13, a variable attenuator (a first variable attenuator) 14, a variable phase-shifter (a first variable phase-shifter) 15, a main amplifier (a first main amplifier) 16, a hybrid (a second hybrid) 17, a hybrid (a fifth hybrid) 21, a variable attenuator (a second variable attenuator) 22, a variable phase-shifter (a second variable phase-shifter) 23, a coaxial delay line (a second coaxial delay line) 31, a variable attenuator (a third variable attenuator) 32, a variable phase-shifter (a third variable phase-shifter) 33, a hybrid (a sixth hybrid) 34, a preamplifier (a second preamplifier) 35, a main amplifier (a second main amplifier) 36, and a hybrid (a third hybrid) 37.

In order to perform control, the distortion compensating amplifier in this embodiment includes a pilot injecting unit 41, a hybrid 42, a hybrid 43, a pilot detecting unit 44, a power detecting unit 45, a hybrid 46, a rectifier 47, an error level detecting unit 48, and a hybrid 49.

In this embodiment the variable attenuators 2, 14, 22, and 32 are used in order to adjust a level of a signal. However, it is also possible to use variable amplifiers that amplify a signal at a variable gain instead of the variable attenuators.

Figure 2:
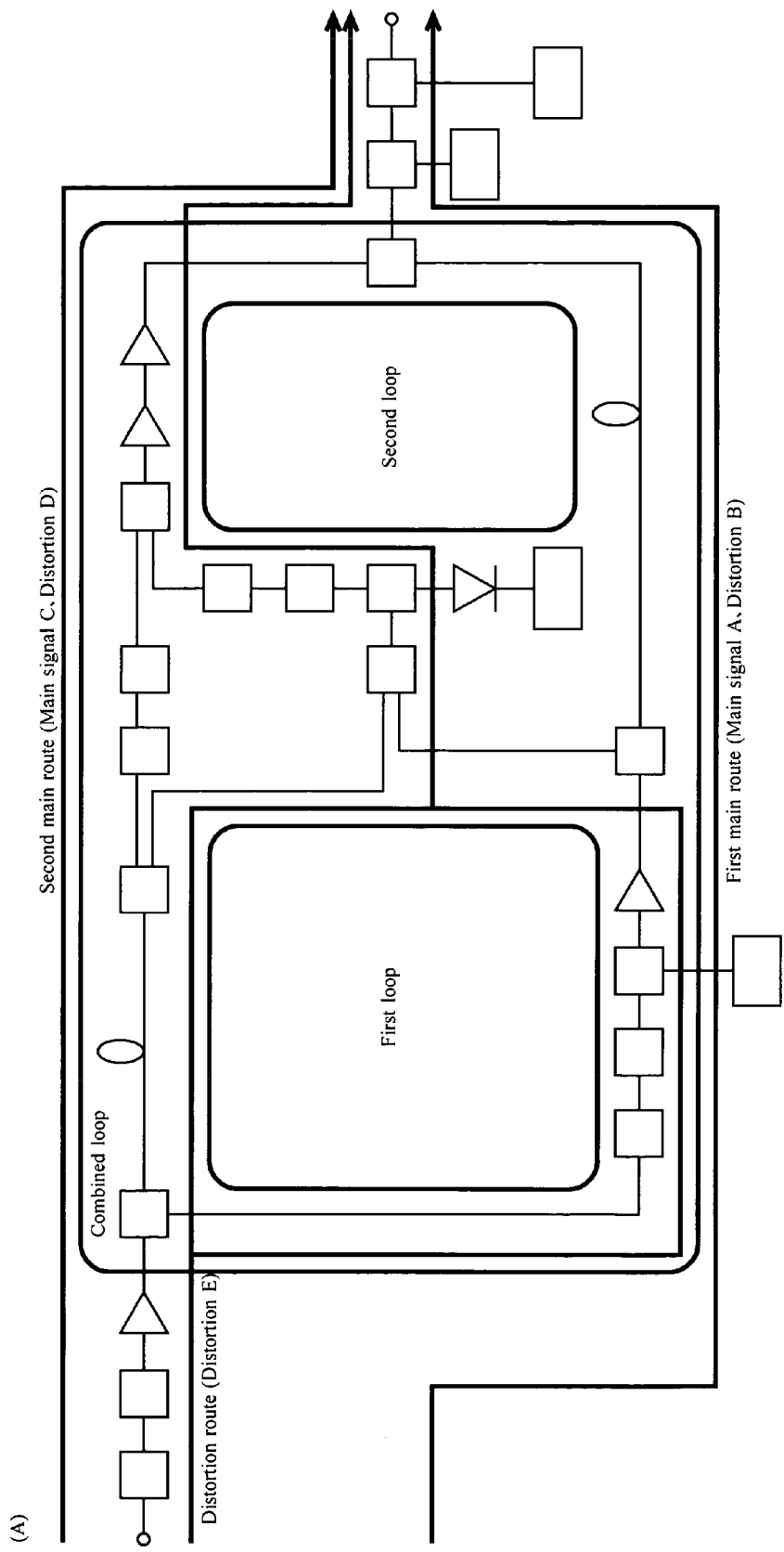
FIG. 2A is a diagram showing routes and loops in the distortion compensating amplifier.
FIG. 2B is a diagram showing an example of a constitution of the distortion compensating amplifier.

A first main route, a second main route, and a distortion route in the distortion compensating amplifier in this embodiment are shown in FIG. 2A. A first loop that is a loop between the first hybrid 11 and the fifth hybrid 21, a second loop that is a loop between the second hybrid 17 and the third hybrid 37, and a combined loop between the first hybrid 11 and the third hybrid 37 are also shown in FIG. 2A.

Briefly, a signal obtained by amplifying a first main signal is transmitted on the first main route, a signal obtained by amplifying a second main signal is transmitted on the second main route, and distortion is detected and transmitted on the distortion route.

Vector adjustment for distortion detection is performed by the first variable attenuator 14 and the first variable phase-shifter 15 on the first loop. Vector adjustment for distortion is performed by the second variable attenuator 22 and the second variable phase-shifter 23 on the second loop. Vector adjustment for a main signal is performed by the third variable attenuator 32 and the third variable phase-shifter 33 on the combined loop.

An example of operations performed by the distortion compensating amplifier in this embodiment will be described.

The first main route will be explained.

A signal inputted from an input terminal IN is phase-shifted by the variable phase-shifter 1, attenuated by the variable attenuator 2, amplified by the preamplifier 3, and inputted to the hybrid 11 serving as a directional coupler. In this embodiment, the preamplifier 3 is used at operating points, the number of which is set not to cause distortion. Apart of the signal is extracted by the hybrid 11 and outputted to the variable attenuator 14. This signal is attenuated by the variable attenuator 14, phase-shifted by the variable phase-shifter 15, and amplified by the main amplifier 16. The signal amplified passes through the hybrid 17 serving as a directional coupler and further passes through the coaxial delay line 31 to be inputted to the hybrid 37 serving as a directional coupler. A signal on a main line (a main signal) amplified at this point is set as A (in the explanation of this embodiment, representing a vector) and distortion components on the main line are set as B (in the explanation of this embodiment, representing a vector).

The zeroth variable phase-shifter 1, the zeroth variable attenuator 2, and the first preamplifier 3 are devices for adjusting a gain and a phase of the entire signal. However, the zeroth variable phase-shifter 1, the zeroth variable attenuator 2, and the first preamplifier 3 do not have to be provided.

The second main route will be explained.

A signal inputted from the input terminal IN passes through the variable phase-shifter 1, the variable attenuator 2, and the preamplifier 3 to be inputted to the hybrid 11 serving as a directional coupler. This signal further passes through the coaxial delay line 12 to be inputted to the hybrid 13 serving as a directional coupler. This signal is divided into two signals by the hybrid 13. One divided signal is attenuated by the variable attenuator 32, phase-shifted by the variable phase-shifter 33, and inputted to the hybrid 34 serving as a directional coupler. The one divided signal and a signal on the distortion route are combined in the hybrid 34. A combined signal is amplified by the preamplifier 35, amplified by the main amplifier 36, and inputted to the hybrid 37. In this embodiment, same amplifiers are used as the first main amplifier 16 and the second main amplifier 36. The first main amplifier 16 and the second main amplifier 36 are used in places where electric powers of outputs are the same. A signal on the main line (a main signal) amplified at this point is set as C (in the explanation of this embodiment, representing a vector) and distortion components on the main line are set as D (in the explanation of this embodiment, representing a vector).

The preamplifier 35 does not have to be provided.

The distortion route will be explained.

A signal inputted from the input terminal IN passes through the variable phase-shifter 1, the variable attenuator 2, and the preamplifier 3 to be inputted to the hybrid 11 serving as a directional coupler. The signal is divided into two signals by the hybrid 11. One of the signals divided by the hybrid 11 passes through the coaxial delay line 12 to be inputted to the hybrid 13. The signal is divided into two signals by the hybrid 13. One of the signals divided by the hybrid 13 is inputted to the hybrid 21 serving as a directional coupler. The other of the signals divided by the hybrid 11 passes through the variable attenuator 14, the variable phase-shifter 15, and the first main amplifier 16 to be inputted to the hybrid 17 serving as a directional coupler. A part of the signal is extracted by the hybrid 17. The part of the signal extracted by the hybrid 17 is inputted to the hybrid 21. In this case, a variable attenuation amount in the variable attenuator 14 and a variable phase-shift amount in the variable phase-shifter 15 are adjusted such that the signal on the path passing on the coaxial delay line 12 and the signal on the path passing on the first main amplifier 16 are in a relation in which the signals have opposite phases at the same amplitude. According to such adjustment, the signal on the main line (the main signal) is canceled and only a part of the distortion components occurring in the first main amplifier 16 are outputted from the hybrid 21.

The distortion components outputted from the hybrid 21 are attenuated by the variable attenuator 22, phase-shifted by the variable phase-shifter 23, and inputted to the hybrid 34 serving as a directional coupler. The distortion components are combined with the signal on the second main route by the hybrid 34. A combined signal passes through the preamplifier 35 and the main amplifier 36 to be inputted to the hybrid 37. A signal of the distortion components amplified at this point (the distortion components on the distortion route) is set as E (in the explanation of this embodiment, representing a vector).

In this embodiment, since the signal E of the distortion components has extremely small electric power compared with the signal on the main line (the main signal), it is considered that distortion due to the signal E does not occur.

A signal obtained by combining the signals A and B on the first main route, the signals C and D on the second main route, and the signal E on the distortion route is outputted from the output terminal OUT as an amplified signal after distortion compensation.

The control system will be explained.

The control in this embodiment is performed by, for example, a control unit (not shown).

For control of the first loop, the hybrid 46 serving as a directional coupler is provided at a post-stage of the fifth hybrid 21. A part of a signal of distortion components outputted from the fifth hybrid 21 is extracted by the hybrid 46. The signal extracted is inputted to the error level detecting unit 48 via the rectifier 47 to detect a level of the signal (a level of the distortion components). A variable attenuation amount in the first variable attenuator 14 and a variable phase-shift amount in the first variable phase-shifter 15 are adjusted such that the level of the distortion components detected (an error level) is reduced (e.g., minimized).

For control of the second loop, the hybrid 42 serving as a directional coupler is provided between the first variable phase-shifter 15 and the first main amplifier 16. A pilot signal having a predetermined frequency generated by the pilot injecting unit 41 is injected into a signal on the first main route via the hybrid 42. A hybrid 43 serving as a directional coupler is provided at a post-stage of the third hybrid 37. A part of an output signal is extracted by the hybrid 43. A level of components of a pilot signal (a pilot level) included in the signal extracted is detected by the pilot detecting unit 44. The pilot signal is monitored in this way to adjust a variable attenuation amount in the second variable attenuator 22 and a variable phase-shift amount in the second variable phase-shifter 23. For example, when characteristics of the main amplifiers 16 and 36 and the preamplifier 35 are grasped, the pilot level is adjusted to be closer to a predetermined value.

As another example, for control of the second loop, the hybrid 49 serving as a directional coupler is provided at a post-stage of the third hybrid 37. A part of an output signal is extracted by the hybrid 49. A level (e.g., power) of distortion components included in the signal extracted is detected by the power detecting unit 45. A variable attenuation amount in the second variable attenuator 22 and a variable phase-shift amount in the second variable phase-shifter 23 are adjusted such that the level of the distortion components detected is reduced (e.g., minimized).

For control of the combined loop, the hybrid 49 serving as a directional coupler is provided at a post-stage of the third hybrid 37. A part of an output signal is extracted by the hybrid 49. A level (e.g., power) of a main signal included in the signal extracted is detected by the power detecting unit 45. The level of the main signal included in the output signal is monitored in this way to adjust a variable attenuation amount in the third variable attenuator 32 and a variable phase-shift amount in the third variable phase-shifter 33 such that this level is increased (e.g., maximized).

It is possible to realize the control in the control system according to, for example, software control based on a detected level. It is also possible to perform control based on a detection level after setting a stored value, for example, storing a set value (an attenuation amount or a phase-shift amount) at the last power-off of the distortion attenuating amplifier and setting the stored value at the next power-on.

Another example of the constitution near an output terminal of the distortion compensating amplifier in this embodiment is shown in FIG. 2b. Specifically, a 3 dB coupler 51 is used as the third hybrid 37 and a power detecting unit 52 is provided at an output terminal different from an output terminal OUT of the 3 dB coupler 51. In this case, for example, it is possible to perform control such that power detected by the power detecting unit 52 is reduced (e.g., minimized).

A specific example of a state of a main signal and a signal of distortion components will be described.

As described above, the signals on the main line (the main signals) A and C and the signals of the distortion components B, D, and E are inputted to the third directional coupler 37.

A phase of the A vector is set as $\theta 1$, a phase of the B vector is set as $\theta 2$, a phase of the C vector is set as $\theta 3$, a phase of the D vector is set as $\theta 4$, a phase of the E vector is set as $\theta 5$, and a phase of (D+E) obtained by combining the D vector and the E vector is set as $\theta 6$.

The main signals A and C will be explained.

A signal inputted from the input terminal IN is divided into two signals by the first hybrid 11. One signal is amplified by the first main amplifier 16 and passes through the coaxial delay line 31 to be inputted to the third hybrid 37 (this signal is the main signal A). The other signal passes through the coaxial delay line 12 and further passes through the third variable attenuator 32, the third variable phase-shifter 33, and the like. Then, the other signal is amplified by the second main amplifier 36 to be inputted to the third hybrid 37 (this signal is the main signal C). In this case, the third variable attenuator 32 and the third variable phase-shifter 33 are adjusted such that the signal A on the path passing through the first main amplifier 16 and the coaxial delay line 31 and the signal C on the path passing through the coaxial delay line 12 and the second main amplifier 36 are in a relation in which the signals have the same phase at the same amplitude. According to such adjustment, components of the main signals are combined to reinforce each other.

Figure 3:
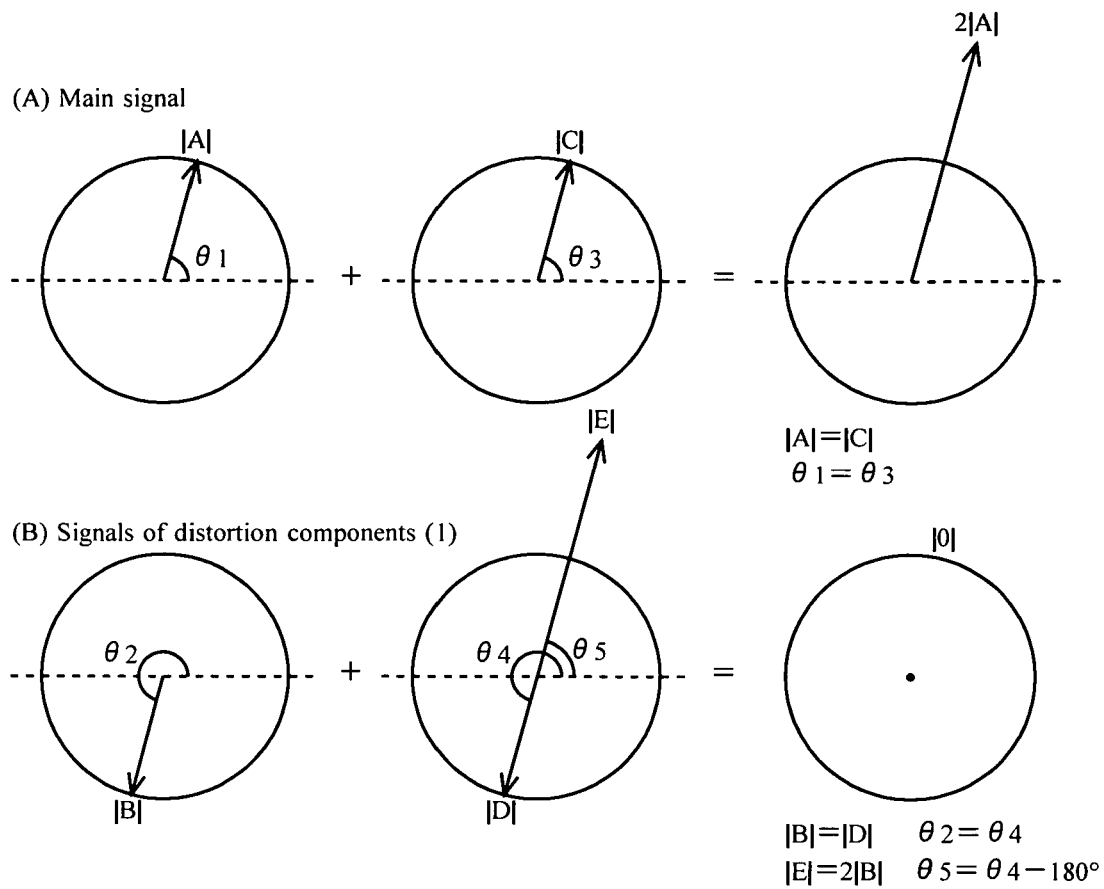
FIGS. 3A and 3B are diagrams showing examples of a state of combination of distortion components.

An example of a state of combination of the main signals A and C is shown in FIG. 3A. In this example, the mains signals A and C are adjusted in such a manner as |A|=|C| and $\theta 1 = \theta 3$. As a result of the combination, a main signal having an amplitude twice as large as that of the main signal A (2|A|) is outputted.

The signals B, D, and E of the distortion components will be explained.

A signal of distortion components generated in the first main amplifier 16 is divided into two signals by the second hybrid 17. One signal passes through the coaxial delay line 31 to be inputted to the third hybrid 37 (this signal is the signal B). The other signal is extracted by the fifth hybrid 21, subjected to adjustment of an amplitude and a phase, and combined with a signal passing on the coaxial delay line 12 side by the sixth hybrid 34. Thereafter, a combined signal is amplified by the second main amplifier 36 to be inputted to the third hybrid 37 (this signal is the signal (D+E)). In this case, the second variable attenuator 22 and the second variable phase-shifter 23 are adjusted such that the signal B of the distortion components on the path passing on the coaxial delay line 31 side and the signal (D+E) of the distortion components on the path passing on the second main amplifier 36 side are in a relation in which the signals have opposite phases at the same amplitude. According to such adjustment, the signals B and (D+E) of the distortion components are erased (canceled) as a whole and the distortion components are not included in the output signal supplied from the third hybrid 37.

An example of a state of combination of the signals B, D, and E of the distortion components at the time when identical amplifiers are used as the two main amplifiers 16 and 36 as in this embodiment is shown in FIG. 3B. In this example, the signals are adjusted in such a manner as $|B|=|D|$, $\theta 2=\theta 4$, $|E|=2|B|$, and $\theta 5=\theta 4-180$ degrees. As a result of the combination, a level of signals of distortion components is reduced to zero.

In this embodiment, amplifiers having identical characteristics are used as the two main amplifiers 16 and 36. For example, it is also possible to use amplifiers having different characteristics.

Figure 4:
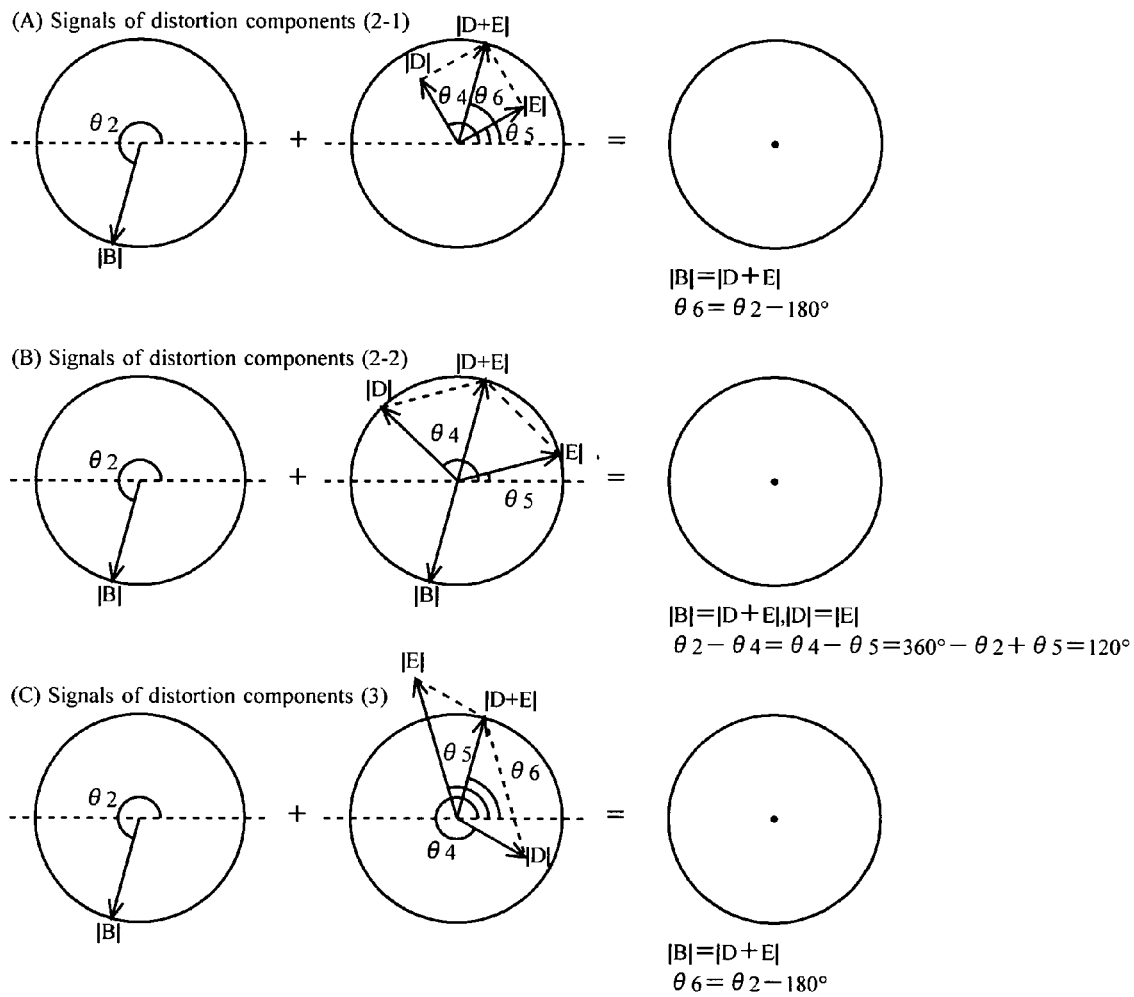
FIGS. 4A to 4C are diagrams showing examples of a state of combination of distortion components.
Figure 5:
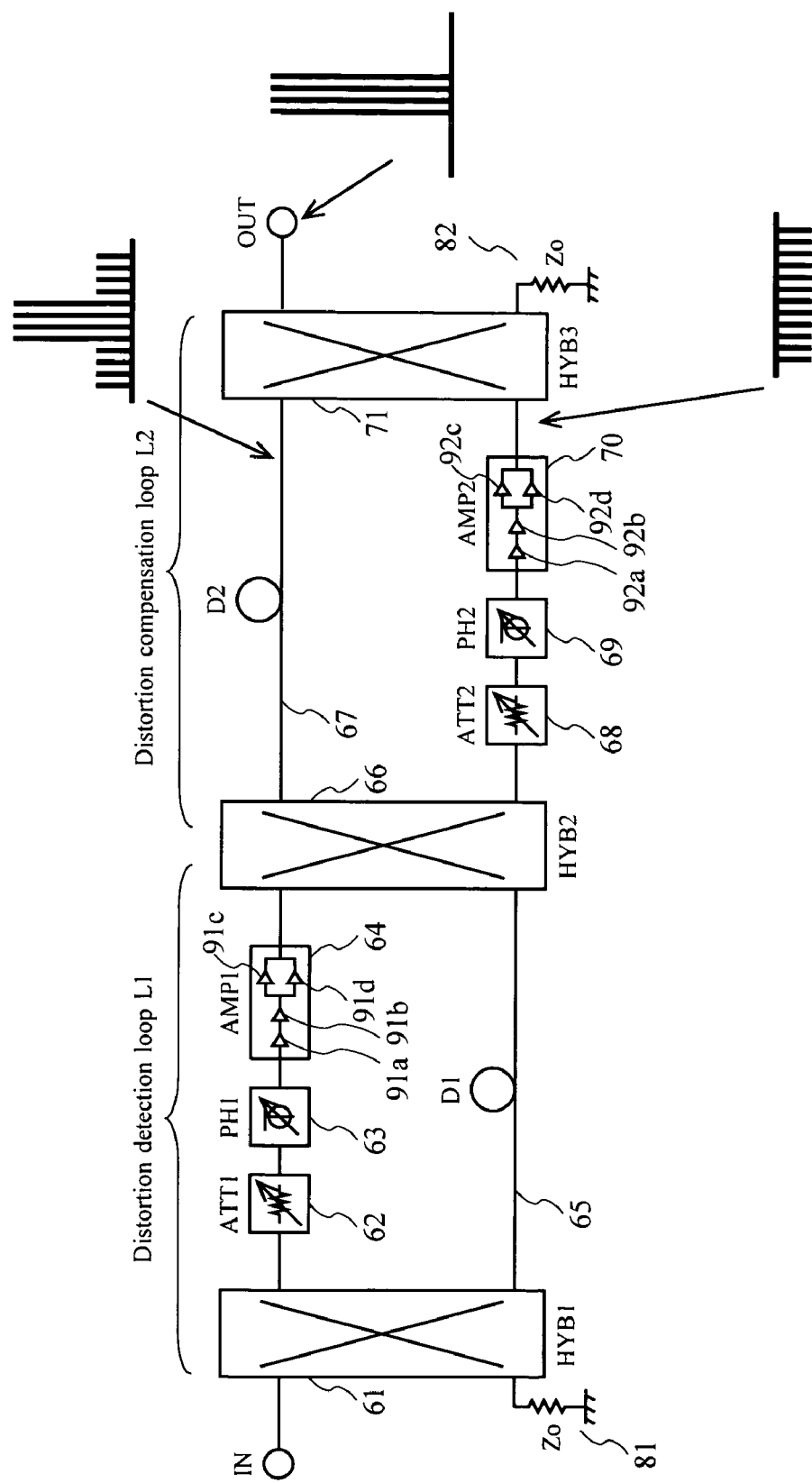
FIG. 5 is a diagram showing an example of a constitution of a feed forward amplifier.
Figure 6:
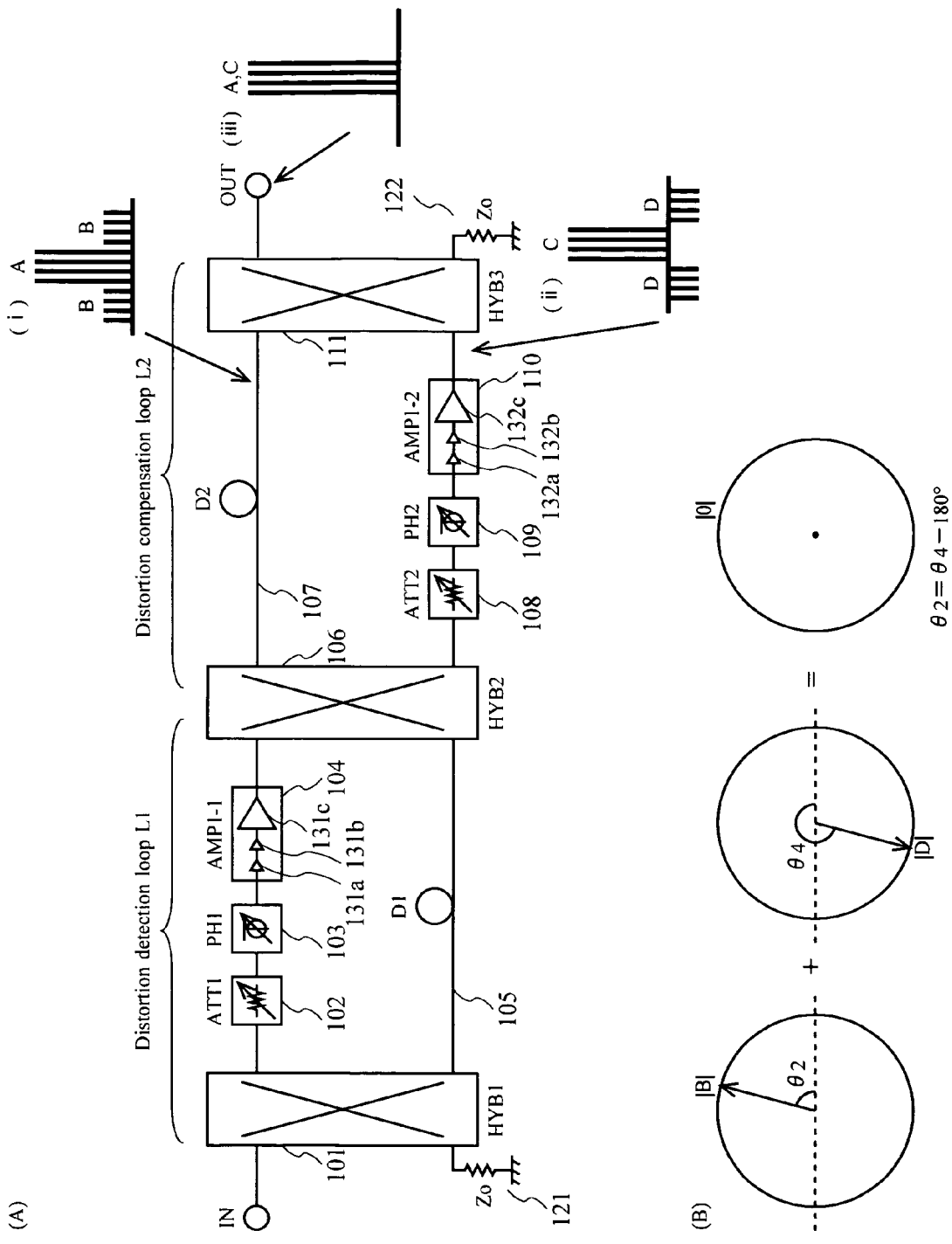
FIG. 6A is a diagram showing an amplifier of a cross-cancel system.
FIG. 6B is a diagram showing an example of a state of combination of distortion components.

An example of states of combination of the signals B, D, and E of the distortion components at the time when amplifiers having different characteristics are used as the two main amplifiers 16 and 36 is shown in FIGS. 4A, 4B, and 4C.

In FIG. 4A, for example, the signals are adjusted in such a manner as $|B|=|D+E|$ and $\theta 6=\theta 2-180$ degrees. As a result of the combination, a level of signals of distortion components is reduced to zero.

In FIG. 4B, for example, the signals are adjusted in such a manner as $|B|=|D+E|$, $|D|=|E|$, and $\theta 2-\theta 4=\theta 4-\theta 5=360$ degrees$-\theta 2+\theta 5=120$ degrees. As a result of the combination, a level of signals of distortion components is reduced to zero.

In FIG. 4C, for example, the signals are adjusted in such a manner as $|B|=|D+E|$ and $\theta 6=\theta 2-180$ degrees. As a result of the combination, a level of signals of distortion components is reduced to zero.

As a preferred example of the constitution, it is possible to use a constitution in which an output level (e.g., power) of the second main amplifier 36 is larger than that of the first main amplifier 16.

As a specific example of a circuit configuration, it is possible to constitute the second main amplifier 36 by providing plural identical amplifiers in parallel. As an example, it is possible to constitute the second main amplifier 36 by providing plural amplifiers identical with the first main amplifier 16 in parallel.

As described above, the distortion compensating amplifier in this embodiment performs distortion compensation by combining necessary main signals and canceling distortion component using two or more same amplifiers or different amplifiers.

For example, concerning main signals, the main signal A passing through the first main amplifier 16 and the main signal C passing through the second main amplifier 36 are combined to amplify a level of the main signals. Concerning signals of distortion components, the distortion component B generated in the first main amplifier 16, the distortion component E generated from the distortion component B passing through the second main amplifier 36, and the distortion component D generated in the second main amplifier 36 are combined to cancel the distortion components. Phases and amplitudes of the main signals and the distortion components can be controlled, respectively. This makes it possible to amplify only necessary main signals and cancel the distortion components.

Therefore, in the distortion compensating amplifier in this embodiment, it is possible to control amplitudes and phases separately for the signals on the main line (the main signals) and the signals of the distortion components. This makes it possible to perform detailed control and highly accurately compensate for intermodulation distortion occurring in the main amplifiers 16 and 36. In the distortion compensating amplifier in this embodiment, for example, an auxiliary amplifier necessary in the FF amplification system is not required. Thus, it is possible to realize high efficiency compared with the FF amplification system.

Constitutions of the distortion compensating amplifier and the like according to the invention are not always limited to those described above. Various constitutions may be used as constitutions of the distortion compensating amplifier and the like. It is also possible to provide the invention as a method or a system for executing the processing according to the invention, a program for realizing such a method or system, a recording medium for recording the program, and the like. It is also possible to provide the invention as various apparatuses and systems.

A field of application of the invention is not always limited to that described above. It is possible to apply the invention to various fields.

The various kinds of processing performed in the distortion compensating amplifier according to the invention may be controlled, in hardware resources including a processor, a memory, and the like, by the processor that executes a control program stored in a Read Only Memory (ROM). Respective functional units for executing the processing may be constituted as independent hardware circuits.

It is also possible to grasp the invention as computer readable recording media such as a floppy (registered trademark) disk and a Compact Disc (CD)—ROM having stored therein the control program. It is possible to cause the processor to carry out the processing according to the invention by inputting the control program to a computer from the recording media and causing the processor to execute the control program.

As explained above, according to the distortion compensating amplifier of the invention, in the first amplifying unit, a first signal consisting of a main signal to be amplified is amplified by the first main amplifier to detect distortion occurring in the first main amplifier. In the distortion adjusting unit, the distortion detected in the first amplifying unit is subjected to vector adjustment. In the second amplifying unit, a second signal consisting of a main signal to be amplified and the distortion supplied from the distortion adjusting unit are combined and a combined signal is amplified by the second main amplifier. In the combining unit, an amplified signal supplied from the first amplifying unit and an amplified signal supplied from the second amplifying unit are combined. Thus, it is possible to realize highly accurate and highly efficient distortion compensation.

What is claimed is:

1. A distortion compensating amplifier that compensates for distortion occurring in a main amplifier, comprising:
    a first amplifying unit that amplifies, with a first main amplifier, a first signal consisting of a main signal to be amplified and detects distortion occurring in the first main amplifier;
    a distortion adjusting unit that subjects the distortion detected by the first amplifying unit to vector adjustment;

a second amplifying unit that combines a second signal consisting of the main signal to be amplified and the distortion supplied from the distortion adjusting unit and amplifies a combined signal with a second main amplifier; and a combining unit that combines an amplified signal supplied from the first amplifying unit and an amplified signal supplied from the second amplifying unit.

2. A distortion compensating amplifier according to claim 1, wherein the first amplifying unit includes means that subjects the first signal amplified by the first main amplifier to vector adjustment, the second amplifying unit includes means that subjects the second signal to vector adjustment, and the distortion compensating amplifier includes means that controls the vector adjustment in the first amplifying unit, the vector adjustment in the distortion adjusting unit, and the vector adjustment in the second amplifying unit.

3. The distortion compensating amplifier according to claim 2, wherein the first amplifying unit includes:

means that divides the first signal;

means that subjects one divided signal to vector adjustment;

the first main amplifier that amplifies a signal after the vector adjustment; and means that combines an amplified signal amplified by the first main amplifier and the other divided signal to detect distortion included in the amplified signal, the second amplifying unit includes:

means that subjects the second signal to vector adjustment;

means that combines a signal after the vector adjustment and distortion supplied from the distortion adjusting unit; and the second main amplifier that amplifies a combined signal, and the combining unit combines the first signal amplified by the first main amplifier in the first amplifying unit and distortion occurring in the first main amplifier, the distortion after passing through the second amplifying unit via the distortion adjusting unit, and the second signal amplified by the second main amplifier in the second amplifying unit and distortion occurring in the second main amplifier.

4. A distortion compensating amplifier according to claim 3, wherein in the distortion adjusting unit, means that subjects distortion detected in the first amplifying unit to vector adjustment includes a variable attenuator and a variable phase-shifter, in the first amplifying unit, the means that divides the first signal includes a hybrid, the means that adjusts one divided signal to vector adjustment includes a variable attenuator and a variable phase-shifter, and the means that combines an amplified signal amplified by the first main amplifier and the other divided signal and detects distortion included in the amplified signal includes a hybrid, and in the second amplifying unit, the means that subjects the second signal to vector adjustment includes a variable attenuator and a variable phase-shifter and the means that combines a signal after the vector adjustment and distortion supplied from the distortion adjusting unit includes a hybrid.

5. A distortion compensating amplifier according to claim 2, further comprising means that adds a pilot signal to a signal amplified by the first main amplifier;

means that detects a level of a pilot signal included in an output signal supplied from the combining-unit;

means that controls vector adjustment in the distortion adjusting unit on the basis of the level of the pilot signal detected;

means that detects a level of distortion detected by the first amplifying unit;

means that controls vector adjustment in the first amplifying unit to reduce the level of the distortion detected;

means that detects a level of a main signal included in an output signal supplied from the combining unit; and means that controls vector adjustment in the second amplifying unit to increase the level of the main signal detected.

6. A distortion compensating amplifier according to claim 2, further comprising:

means that detects a level of distortion included in an output signal supplied from the combining unit;

means that controls vector adjustment in the distortion adjusting unit to reduce the level of the distortion detected;

means that detects a level of distortion detected by the first amplifying unit;

means that controls vector adjustment in the first amplifying unit to reduce the level of the distortion detected;

means that detects a level of a main signal included in an output signal supplied from the combining unit; and means that controls vector adjustment in the second amplifying unit to increase the level of the main signal detected.

7. A distortion compensating amplifier according to claim 2, wherein amplifiers having identical characteristics are used as the first main amplifier and the second main amplifier.

8. A distortion compensating amplifier according to claim 2, wherein the second main amplifier is constituted as an amplifier having higher power compared with the first main amplifier.

9. A distortion compensating amplifier according to claim 8, wherein the second main amplifier is constituted by providing plural amplifiers identical with the first main amplifier in parallel.

10. A distortion compensating amplifier according to claim 2, wherein amplifiers having different characteristics are used as the first main amplifier and the second main amplifier.

11. A distortion compensating amplifier according to claim 1, wherein amplifiers having identical characteristics are used as the first main amplifier and the second main amplifier.

12. A distortion compensating amplifier according to claim 1, wherein the second main amplifier is constituted as an amplifier having higher power compared with the first main amplifier.

13. A distortion compensating amplifier according to claim 12, wherein the second main amplifier is constituted by providing plural amplifiers identical with the first main amplifier in parallel.

14. A distortion compensating amplifier according to claim 1, wherein amplifiers having different characteristics are used as the first main amplifier and the second main amplifier.

15. A base station apparatus that amplifies a multi-carrier signal as a main signal, the base station apparatus comprising a distortion compensating amplifier that compensates for distortion occurring in a main amplifier, wherein the distortion compensating amplifier includes:

a first amplifying unit that amplifies, with a first main amplifier, a first signal consisting of a main signal to be amplified and detects distortion occurring in the first main amplifier;

a distortion adjusting unit that subjects the distortion detected by the first amplifying unit to vector adjustment;

a second amplifying unit that combines a second signal consisting of the main signal to be amplified and the distortion supplied from the distortion adjusting unit and amplifies a combined signal with a second main amplifier; and a combining unit that combines an amplified signal supplied from the first amplifying unit and an amplified signal supplied from the second amplifying unit.

16. A base station apparatus according to claim 15, wherein, in the distortion compensating amplifier, the first amplifying unit includes means that subjects the first signal amplified by the first main amplifier to vector adjustment, the second amplifying unit includes means that subjects the second signal to vector adjustment, and the distortion compensating amplifier includes means that controls the vector adjustment in the first amplifying unit, the vector adjustment in the distortion adjusting unit, and the vector adjustment in the second amplifying unit.

17. A base station apparatus according to claim 15, wherein, in the distortion compensating amplifier, the second main amplifier is constituted as an amplifier having higher power compared with the first main amplifier.

18. A relay station apparatus that amplifies a multi-carrier signal as a main signal, the relay station apparatus comprising a distortion compensating amplifier that compensates for distortion occurring in a main amplifier, wherein the distortion compensating amplifier includes:

a first amplifying unit that amplifies, with a first main amplifier, a first signal consisting of a main signal to be amplified and detects distortion occurring in the first main amplifier;

a distortion adjusting unit that subjects the distortion detected by the first amplifying unit to vector adjustment;

a second amplifying unit that combines a second signal consisting of the main signal to be amplified and the distortion supplied from the distortion adjusting unit and amplifies a combined signal with a second main amplifier; and a combining unit that combines an amplified signal supplied from the first amplifying unit and an amplified signal supplied from the second amplifying unit.

19. A relay station apparatus according to claim 18, wherein, in the distortion compensating amplifier, the first amplifying unit includes means that subjects the first signal amplified by the first main amplifier to vector adjustment, the second amplifying unit includes means that subjects the second signal to vector adjustment, and the distortion compensating amplifier includes means that controls the vector adjustment in the first amplifying unit, the vector adjustment in the distortion adjusting unit, and the vector adjustment in the second amplifying unit.

20. A relay station apparatus according to claim 18, wherein, in the distortion compensating amplifier, the second main amplifier is constituted as an amplifier having higher power compared with the first main amplifier.

* * * * *